(12) United States Patent
Thomsen et al.

(10) Patent No.: US 7,198,699 B2
(45) Date of Patent: Apr. 3, 2007

(54) SPUTTER COATING APPARATUS INCLUDING ION BEAM SOURCE(S), AND CORRESPONDING METHOD

(75) Inventors: Scott V. Thomsen, Milford, MI (US); Hugh A. Walton, Davisburg, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 300 days.

(21) Appl. No.: 10/429,967

(22) Filed: May 6, 2003

(65) Prior Publication Data

US 2004/0020761 A1 Feb. 5, 2004

Related U.S. Application Data

(60) Provisional application No. 60/377,620, filed on May 6, 2002, provisional application No. 60/431,192, filed on Dec. 6, 2002.

(51) Int. Cl.
C23C 14/35 (2006.01)
C23C 16/00 (2006.01)

(52) U.S. Cl. .......................... 204/192.12; 204/192.15; 204/192.26; 204/192.27; 204/192.28; 204/298.23; 204/298.25; 204/298.26

(58) Field of Classification Search ........... 204/192.12, 204/192.15, 192.26, 192.27, 192.28, 298.23, 204/298.25, 290.26, 298.26; 118/719
See application file for complete search history.

(56) References Cited

U.S. PATENT DOCUMENTS

| | | | |
|---|---|---|---|
| 3,288,700 A | 11/1966 | Needham et al. | 204/298.23 |
| 3,627,663 A | 12/1971 | Davidse et al. | 204/192.15 |
| 3,787,312 A | 1/1974 | Wagner et al. | 204/298.11 |
| 4,006,073 A | 2/1977 | Welch | 204/298.16 |
| 4,111,150 A | 9/1978 | Donley et al. | 118/704 |
| 4,584,206 A | 4/1986 | Sleighter | 427/109 |
| 4,851,095 A * | 7/1989 | Scobey et al. | 204/192.12 |
| 5,106,474 A | 4/1992 | Dickey et al. | 204/298.14 |
| 5,126,027 A | 6/1992 | Kudo et al. | 204/192.13 |
| 5,170,714 A | 12/1992 | Katagiri | 104/282 |
| 5,205,919 A | 4/1993 | Zejda | |
| 5,215,638 A | 6/1993 | Hausler | 204/192.12 |
| 5,228,968 A | 7/1993 | Zejda | |
| 5,262,032 A | 11/1993 | Hartig et al. | 204/298.21 |

(Continued)

FOREIGN PATENT DOCUMENTS

EP 1 174 397 1/2002

(Continued)

*Primary Examiner*—Rodney G. McDonald
(74) *Attorney, Agent, or Firm*—Nixon & Vanderhye

(57) ABSTRACT

A coating apparatus deposits a first coating (single or multi-layered) onto a first side of a substrate (e.g., glass substrate) passing through the apparatus, and a second coating (single or multi-layered) onto the other or second side of the substrate. In certain example embodiments, the first coating may be deposited via sputtering while the second coating is deposited via ion beam deposition. In such a manner, it is possible to coat both sides of the substrate in a single apparatus in an efficient manner. In other embodiments, the coating apparatus may sputter a coating onto a first side of the substrate and ion beam mill at least one surface of the substrate as the substrate passes through the coating apparatus. In other embodiments of this invention, a dual mode chamber may be provided that is adapted to receive a removable ion beam module on one side of a substrate and a removable sputtering module on the other side of the substrate. The different removable modules may or may not be used simultaneously in different embodiments of this invention.

24 Claims, 9 Drawing Sheets

U.S. PATENT DOCUMENTS

| | | | |
|---|---|---|---|
| 5,298,048 A | 3/1994 | Lingle et al. | 65/60.2 |
| 5,344,718 A | 9/1994 | Hartig et al. | 428/622 |
| 5,376,455 A | 12/1994 | Hartig et al. | 428/428 |
| 5,399,252 A | 3/1995 | Scherer et al. | 204/298.19 |
| 5,403,458 A | 4/1995 | Hartig et al. | 204/192.15 |
| 5,569,362 A | 10/1996 | Lerbet et al. | 204/192.16 |
| 5,753,092 A * | 5/1998 | Hollars et al. | 204/298.26 |
| 5,770,321 A | 6/1998 | Hartig et al. | 428/622 |
| 5,800,933 A | 9/1998 | Hartig et al. | 428/622 |
| 5,846,328 A | 12/1998 | Aruga et al. | 118/718 |
| 5,888,593 A * | 3/1999 | Petrmichl et al. | 427/563 |
| 5,968,328 A | 10/1999 | Teschner et al. | 204/298.25 |
| 6,002,208 A | 12/1999 | Maishev et al. | 315/111.91 |
| 6,014,872 A | 1/2000 | Hartig et al. | 65/58 |
| 6,027,621 A | 2/2000 | Akita et al. | 204/298.06 |
| 6,086,962 A * | 7/2000 | Mahoney et al. | 427/577 |
| 6,153,067 A | 11/2000 | Maishev et al. | 204/298.04 |
| 6,187,159 B1 | 2/2001 | Kamura et al. | 204/292.15 |
| 6,197,164 B1 | 3/2001 | Pinarbasi | 204/192.11 |
| 6,203,677 B1 | 3/2001 | Konig | 204/298.27 |
| 6,207,028 B1 | 3/2001 | Haas et al. | 204/298.19 |
| 6,214,183 B1 | 4/2001 | Maishev et al. | 205/122 |
| 6,238,526 B1 | 5/2001 | Maishev et al. | 204/192.11 |
| 6,250,758 B1 | 6/2001 | Yoshihara et al. | 351/163 |
| 6,261,693 B1 | 7/2001 | Veerasamy | 428/408 |
| 6,264,751 B1 | 7/2001 | Kamura et al. | 118/725 |
| 6,284,377 B1 | 9/2001 | Veerasamy | 428/408 |
| 6,296,741 B1 | 10/2001 | Pinarbasi | 204/192.11 |
| 6,303,225 B1 | 10/2001 | Veerasamy | 428/408 |
| 6,319,326 B1 * | 11/2001 | Koh et al. | 118/718 |
| 6,336,999 B1 | 1/2002 | Lemmer et al. | 204/192.13 |
| 6,338,901 B1 | 1/2002 | Veerasamy | 428/408 |
| 6,359,388 B1 | 3/2002 | Petrmichl | 315/111.81 |
| 6,368,664 B1 * | 4/2002 | Veerasamy et al. | 427/249.7 |
| 6,455,101 B1 * | 9/2002 | Sasaki et al. | 427/130 |
| 6,488,824 B1 | 12/2002 | Hollars et al. | 204/192.22 |
| 2002/0028286 A1 | 3/2002 | Sasaki et al. | 427/131 |
| 2004/0175511 A1 | 9/2004 | Hartig | 427/534 |

FOREIGN PATENT DOCUMENTS

| | | |
|---|---|---|
| EP | 1 179 516 | 2/2002 |
| JP | 03-122274 | 5/1991 |
| JP | 10-317136 | 12/1998 |
| WO | WO 00/28104 | 5/2000 |
| WO | WO 00/37376 | 6/2000 |
| WO | WO 00/37377 | 6/2000 |

* cited by examiner

SPUTTER COATING APPARATUS INCLUDING ION BEAM SOURCE(S), AND CORRESPONDING METHOD

This application claims priority on Provisional U.S. Patent Application Nos. 60/377,620, filed May 6, 2002, and 60/431,192, filed Dec. 6, 2002, the disclosures of which are both hereby incorporated herein by reference in their entireties.

This invention relates to an apparatus for coating a substrate (e.g., glass substrate) on both major surfaces/sides thereof. In particular, this invention relates to a method and corresponding apparatus for sputtering a coating onto a first side of the substrate and ion beam depositing another coating onto the other side of the substrate. In other embodiments, this invention relates to a coating apparatus which sputters a coating onto a first surface of a substrate passing therethrough and ion beam mills the first and/or second surface of the substrate in order to remove glass therefrom.

BACKGROUND OF THE INVENTION

Sputter coated glass articles are known in the art. For example, see U.S. Pat. Nos. 5,770,321, 5,298,048, and 5,403,458, each of which disclose coatings sputtered onto substrates and corresponding techniques for the same, all of these patents being hereby incorporated herein by reference. Sputter coated layer systems on glass substrates are typically used for achieving solar management properties (e.g., low emissivity or low-E, UV reflection, and/or the like) in different types of glass articles including but not limited to insulating glass (IG) window units, vehicle windows (e.g., windshields, backlites, sidelites, sunroofs), and/or the like.

Sputter coating may be an electric discharge process, often conducted in a vacuum chamber in the presence of one or more gases. An example sputter coating apparatus typically includes at least one vacuum chamber in which a substrate is located in a stationary or moving fashion, a power source, an anode, and one or more specifically prepared cathode targets of or covered with at least one material (e.g., silicon, zinc, silver, nickel, chrome, tin, aluminum, other materials, or combinations thereof) to be used in creating a layer(s) on the substrate. When an electric potential is applied to the cathode target, the gas(es) (e.g., argon, nitrogen, oxygen, other gases, or combinations thereof) form(s) a plasma that bombards the target causing particles of the coating material to be liberated or lifted from the target itself. The liberated coating material from the target falls onto the underlying substrate and adheres thereto. When conducted in the presence of a reactive gas(es), a reactive product of the coating material from the target and the gas may be deposited on the substrate (e.g., in forming a silicon nitride layer).

For example and without limitation, see FIG. 1 which illustrates a conventional sputter coating apparatus. The apparatus includes six different zones (i.e., zones 1–6) which are separated from one another by curtains or walls 52. Zone 1 includes targets 21–26, zone 2 includes targets 27–29, zone 3 includes targets 30–35, zone 4 includes targets 36–41, zone 5 includes targets 42–44, and zone 6 includes targets 46–50. The sputtering targets may be any suitable type of target including but not limited to planar targets, rotating cylindrical targets, magnetron targets, and/or C-Mag targets. In the example of FIG. 1, targets 27–29 and 42–44 are planar targets, while targets 21–26, 30–41, and 45–50 are rotating cylindrical targets. At least one gas (e.g., argon, nitrogen, oxygen, etc.) may be utilized in each zone at low pressure (i.e., pressure below atmospheric), while vacuum pumps 51 are provided between zones in order to try to reduce the amount of crosstalk (i.e., in order to reduce the amount of gas from one zone leaking into an adjacent zone). A glass substrate is passed through the sputter coater (e.g., at line speed of from 100–300 inches per minute) in order to be coated. For purposes of example and without limitation, a multi-layered solar control coating can be deposited onto the substrate using this sputter coating apparatus as explained in more detail in U.S. Pat. No. 6,336,999, the disclosure of which is hereby incorporated herein by reference.

Other types of sputtering systems/techniques are disclosed in U.S. Pat. Nos. 5,968,328, 5,399,252, 5,262,032, 5,215,638, 6,203,677, 6,207,028, and 5,403,458, and WO 02/04375 (see U.S. Ser. No. 09/794,224), all of which are hereby incorporated herein by reference.

Other example types of sputtering system are known as ion beam assisted sputtering system which utilize an ion beam(s) to help liberate coating material form a target(s). Sputtering devices of this type may be found, for example and without limitation, in any of U.S. Pat. Nos. 6,197,164, 6,296,741, or 6,214,183, all of which are hereby incorporated herein by reference.

Unfortunately, each of the aforesaid sputtering devices are problematic in that they can only coat one side of a substrate at a time. This is undesirable, at least from a processing time and capital expenditure perspective, in situations where it is desired to coat both sides of a substrate. Accordingly, it can be seen that there exists a need in the art for an apparatus which is capable of coating both sides of a substrate without necessarily having to pass the substrate through the apparatus more than one time.

BRIEF SUMMARY OF THE INVENTION

An object of this invention is to provide a coating apparatus capable of coating both sides of a substrate.

In certain example embodiments of this invention, there is provided a coating apparatus which is capable of depositing a first coating (single or multi-layered) onto a first side of a substrate passing through the apparatus, and a second coating (single or multi-layered) onto the other or second side of the substrate passing through the apparatus. In certain example embodiments, the first coating may be deposited via sputtering from at least one target while the second coating may be deposited via at least one ion beam. In such a manner, it is possible to coat both sides of the substrate in a single apparatus in an efficient manner. While it is possible to do so, it is not necessary to run the substrate through the coating apparatus more than one time in order to coat both sides of the substrate.

In certain example embodiments of this invention, there is provided a coating apparatus which sputters a coating onto a first side of a glass substrate passing therethrough, and which ion beam mills the first and/or other side of the substrate in order to remove glass therefrom.

In certain example embodiments of this invention, there is provided a coating apparatus for forming first and second coatings on a glass substrate, the coating apparatus comprising: at least one sputtering target positioned so as to be located at an elevation above a glass substrate passing through the apparatus, wherein the at least one sputtering target is to be used for sputtering a first coating onto a first side of the glass substrate; at least one ion beam source positioned so as to be located at an elevation below the glass substrate, wherein the at least one ion beam source is to be used to ion beam deposit a second coating onto a second side of the glass substrate opposite the first side.

In other example embodiments of this invention, there is provided a method of coating a glass substrate, the method comprising: moving the glass substrate through a coating apparatus; and while the glass substrate is moving through the coating apparatus, simultaneously sputtering a first coating having at least one layer onto a first side of the glass substrate and ion beam depositing a second coating onto a second side of the substrate that is opposite the first side.

In other example embodiments of this invention, there is provided a method of forming first and second coatings on a glass substrate, the method comprising: forming a first coating on a first side of the glass substrate; and while at least part of the first coating is being formed on the first side of the glass substrate, ion beam depositing a second coating onto a second side of the substrate.

In other example embodiments of this invention, there is provided a coating deposition apparatus comprising: a dual mode chamber for selectively receiving a removable ion source module on a first side of a moving substrate and a removable sputtering module on a second side of the substrate.

In still further embodiments of this invention, there is provided a coating deposition apparatus comprising a dual mode chamber for selectively receiving first and second removable ion sources on opposite sides of a moving substrate directly across from one another.

DETAILED DESCRIPTION OF THE INVENTION

Figure 1:
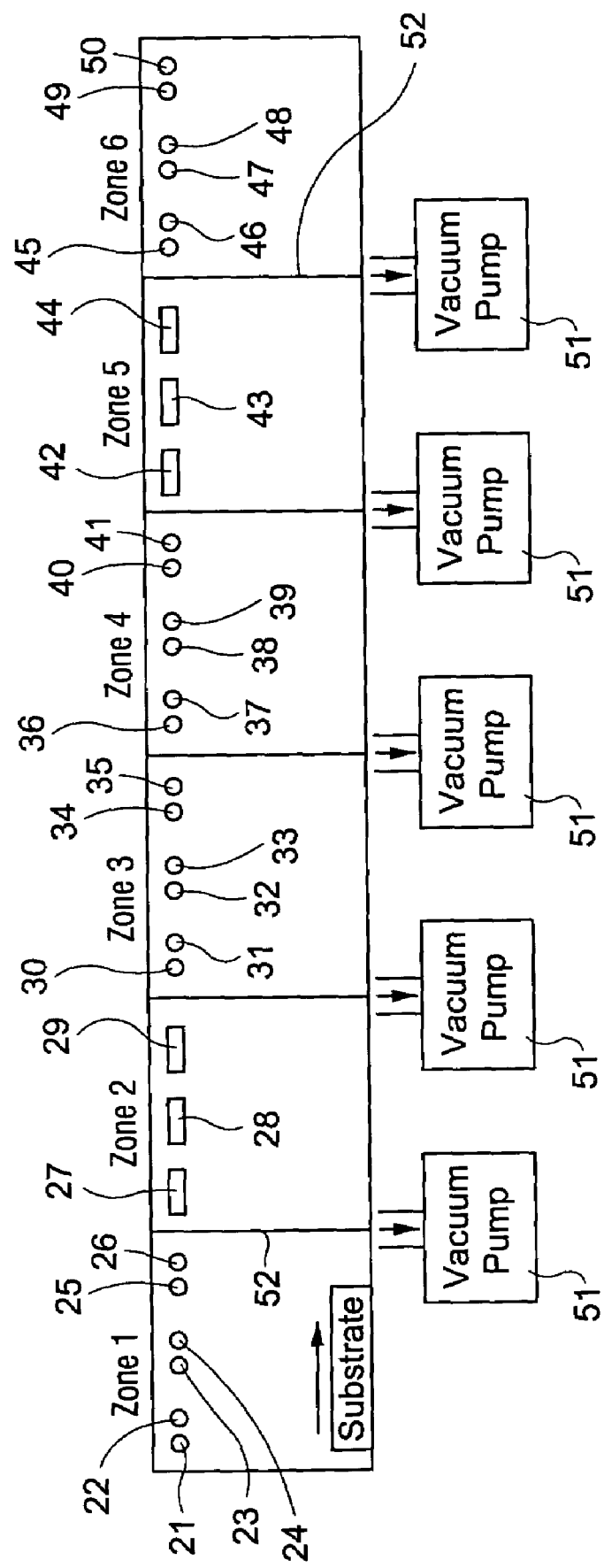
FIG. 1 is a schematic diagram of a conventional sputter coating apparatus.

Referring now more particularly to the accompanying drawings in which like reference numerals indicate like parts throughout the several views.

Figure 2:
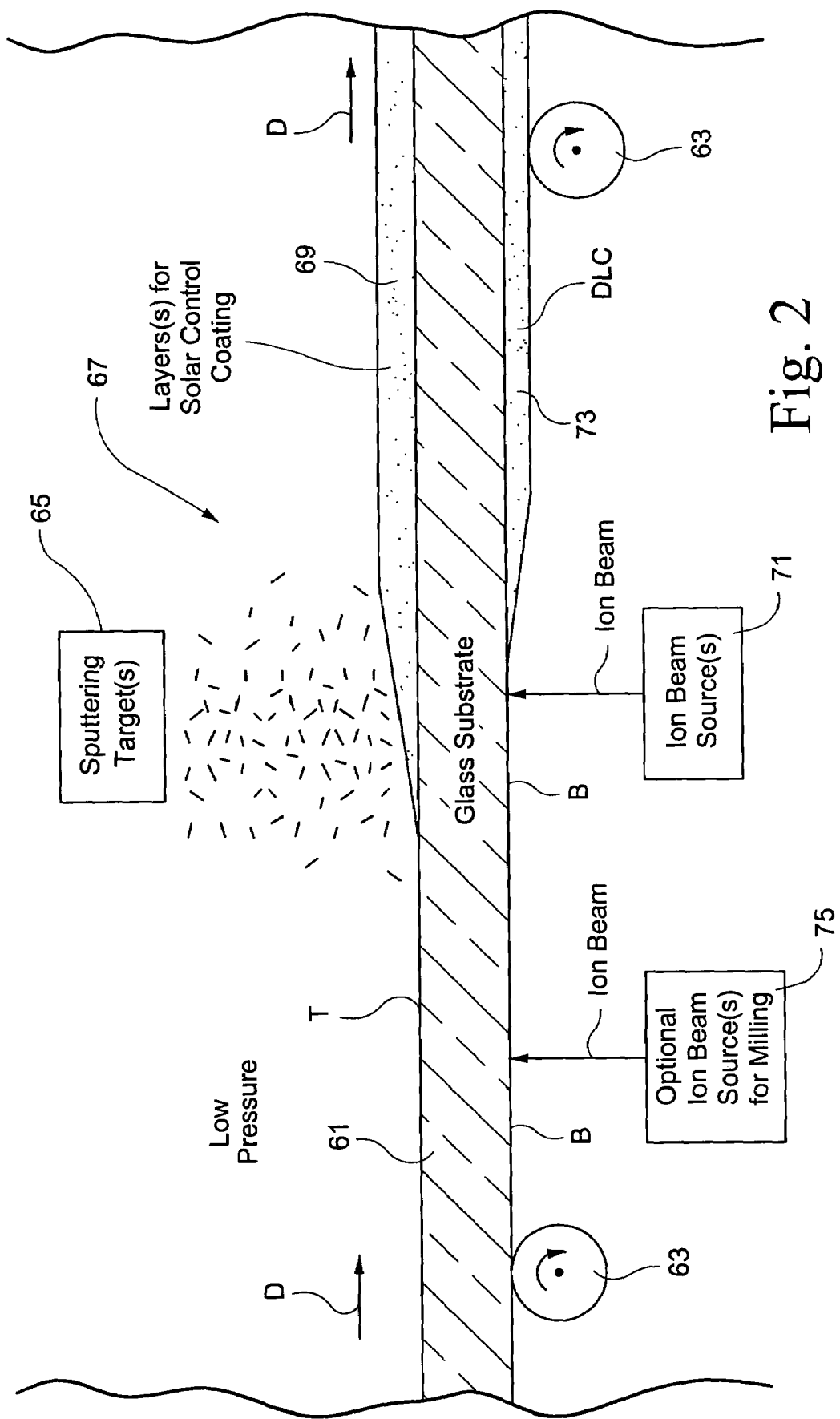
FIG. 2 is a schematic cross sectional diagram of part of a coating apparatus according to an example embodiment of this invention.

FIG. 2 is a perspective view of a coating apparatus according to an example embodiment of this invention. The coating apparatus may include one or more sputter coating chambers and at least one ion beam source used to mill and/or coat the substrate passing therethrough. In the FIG. 2 example, glass substrate 61 is shown passing through the coating apparatus in direction D. Substrate 61 may be conveyed through the coating apparatus by a plurality of rollers 63, or in any other suitable manner.

The coating apparatus includes at least one sputtering target(s) 65. The at least one sputtering target 65 may correspond, for example and without limitation, to one or more of sputtering targets 21–50 of FIG. 1. In the FIG. 2 example (and in FIG. 1), the sputtering target(s) 65 is provided at an elevation above the substrate 61 passing through the coating apparatus so that material 67 to be coated on the substrate falls due at least to gravity from the target onto the substrate 61 passing therebelow in order to coat the top side T of the substrate 61 with sputtered material. Sputtering target(s) 65 may be any suitable type of sputtering target including but not limited to a stationary planar target, a rotating cylindrical target, and/or a C-Mag target. For purposes of example and without limitation, any of the sputtering targets and/or sputtering techniques of one or more of U.S. Pat. Nos. 5,968,328, 5,399,252, 5,262,032, 5,215,638, 6,203,677, 6,207,028, 5,403,458, 5,770,321, 5,298,048, 5,403,458, 6,197,164, 6,296,741, and/or 6,214,183 (all of which are hereby incorporated herein by reference) may be used in order to cause target(s) 65 to sputter a coating including at least one layer onto the substrate 61 passing therebelow. Of course, the instant invention is not so limited, and any suitable sputtering technique may also be used, including ion assisted sputtering. In such a manner, one or more sputtering target(s) cause solar control coating 69 to be sputtered onto the upper side T of substrate 61.

Solar control coating 69, deposited via sputtering using target(s) 65, may include one or more layers. Example solar control coatings 69 of the multi-layer type are disclosed in U.S. Pat. Nos. 6,336,999, 5,770,321, 5,403,458, 5,298,048, 3,649,359, 3,682,528, 4,716,086, and 4,806,220, and U.S. Ser. No. 09/794,224, all of which are incorporated herein by reference. Of course, the instant invention is not so limited, and any other type of single layer or multi-layer coating 69 may be sputtered onto the top side T of substrate 61 by target(s) 65. Example solar control coatings 69 may include at least one infrared (IR) reflecting layer of or including silver (Ag), gold (Au), nickel-chrome (NiCr), or any other suitable material. In certain instances, the at least one IR reflecting layer is metallic or substantially metallic and is sandwiched between at least a pair of dielectric layers. The dielectric layers may be of or include silicon nitride, tin oxide, silicon oxynitride, and/or the like. Each of these layers, including the IR reflecting layer(s) and dielectric layer(s) of coating 69, may be deposited via sputtering, preferably using a plurality of corresponding targets 65 provided above the moving substrate 61. For example, a silicon inclusive target(s) may be used to deposit dielectric layer(s) of silicon nitride of coating 69 in a suitable atmosphere (e.g., using gas such as nitrogen and argon), while Ag target(s) may be used in order to deposit Ag IR reflecting layer(s) of coating 69 in a suitable atmosphere (e.g., using Ar gas). Low pressures are typically used during such sputtering of coating 69 (e.g., see U.S. Pat. Nos. 6,336,999, 5,770,321, and/or 5,298,048), so that the chamber(s) in which the target(s) 65 is located is typically maintained at a pressure less than atmospheric pressure.

Still referring to FIG. 2, the coating apparatus further includes at least one ion beam source(s) 71 which emits an ion beam upwardly toward the substrate 61 in order to coat the bottom side B of the substrate 61 with coating 73. Coating 73, ion beam deposited on the bottom side B of substrate 61, may be a single layer or may include multiple layers in different embodiments of this invention. In certain example embodiments of this invention, ion beam deposited coating 73 may be of or include diamond-like carbon (DLC) and/or any other suitable material that may be ion beam deposited. When coating 73 includes diamond-like carbon (DLC), the coating 73 may be of or include any of the coatings of any of U.S. Pat. Nos. 6,338,901, 6,261,693, 6,284,377, 6,303,225, 5,846,649, 5,637,353 (all incorporated herein by reference), or any other suitable coating that may be ion beam deposited onto the substrate. For example, the at least one layer comprising DLC may include more $sp^3$ carbon-carbon bonds than $sp^2$ carbon-carbon bonds. Moreover, the DLC may be a special type of DLC known as highly tetrahedral amorphous carbon (ta-C) including more $sp^3$ carbon-carbon bonds than sp carbon-carbon bonds. In certain instances, at least 60% of the carbon-carbon bonds in the ta-C may be $sp^3$ carbon-carbon bonds, even more preferably at least 70%. The DLC in certain embodiments may be hydrogentated (e.g., ta-C:H), and may have an average hardness of at least 10 GPa, more preferably of at least 20 GPa. The DLC may be hydrophobic (high contact angle), hydrophilic (low contact angle), or neither in different embodiments of this invention.

It can be seen that the coating apparatus of the instant invention enables both the top T and bottom B sides of moving glass substrate 61 to be coated at the same time as the substrate passes through the coating apparatus. One or more sputtering target(s) 65 is/are used to apply a coating 69 to the top side T of the substrate 61, while one or more ion beam source(s) 71 is/are used to ion beam deposit a coating 73 onto the bottom side B of the substrate 61. In certain example embodiments of this invention, the ion beam source(s) 71 may be in the same chamber (and thus potentially at approximately the same low pressure) as one or more sputtering target(s) 65 (e.g., in zone 6 of FIG. 1). However, in other embodiments of this invention, one or more ion beam source(s) 71 may be in different chambers than sputtering target(s) 65; in such embodiments a different pressure may be used to ion beam deposit than is used to sputter coat. In still further embodiments, a first ion beam source 71 may be in the same chamber as a first sputtering target(s) 65, and a second ion beam source 71 and a second sputtering target(s) 65 may be in a different chamber or zone of the coating apparatus at the same or a different pressure. In each of the above embodiments, the coating apparatus enables one side of the glass substrate 61 to be coated with a solar control coating 69 while at the same time the other side of the substrate 61 can be coated with another coating 73 such as a scratch resistant or protective coating including DLC or any other suitable material.

Optionally, the coating apparatus may include one or more additional ion beam source(s) 75 provided below the substrate for cleaning and/or ion beam milling the bottom surface of the substrate. For example and without limitation, a first ion beam source 75 may be provided (prior to source(s) 71) for ion beam milling at least about 2 Å from the bottom side B of the glass substrate (more preferably for milling or shaving off at least about 5 Å of glass from the substrate 61); and a second ion beam source(s) 71 may be provided thereafter for applying coating 73 to the milled substrate. It has been found that the milling may increase scratch resistance of the coating 73 in certain instances. It is also possible to provide an ion beam source(s) above the substrate for ion beam milling a similar amount of glass from the top side T of the substrate 61 before coating 69 is sputtered thereonto. For example milling techniques/processes/structures that may be used in this regard, see one or more of pending U.S. patent application Ser. Nos. 09/703,709; 10/003,436; and/or 60/340,248, all of which are hereby incorporated herein by reference.

Figure 3:
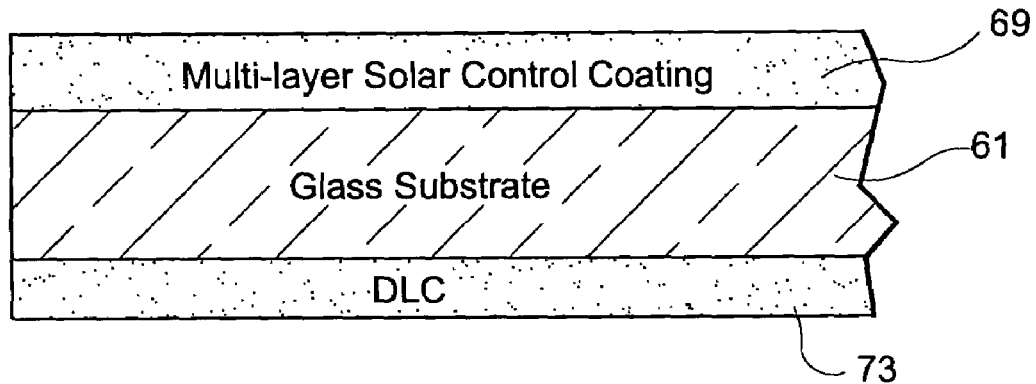
FIG. 3 is a cross sectional view of a coated substrate, including coatings on both sides thereof, which has been coated using a coating apparatus according to an embodiment of this invention.
Figure 4:
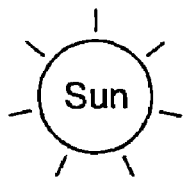
FIG. 4 is a cross sectional view of an insulating glass (IG) window unit made using at least the substrate of FIG. 3.
Figure 4:
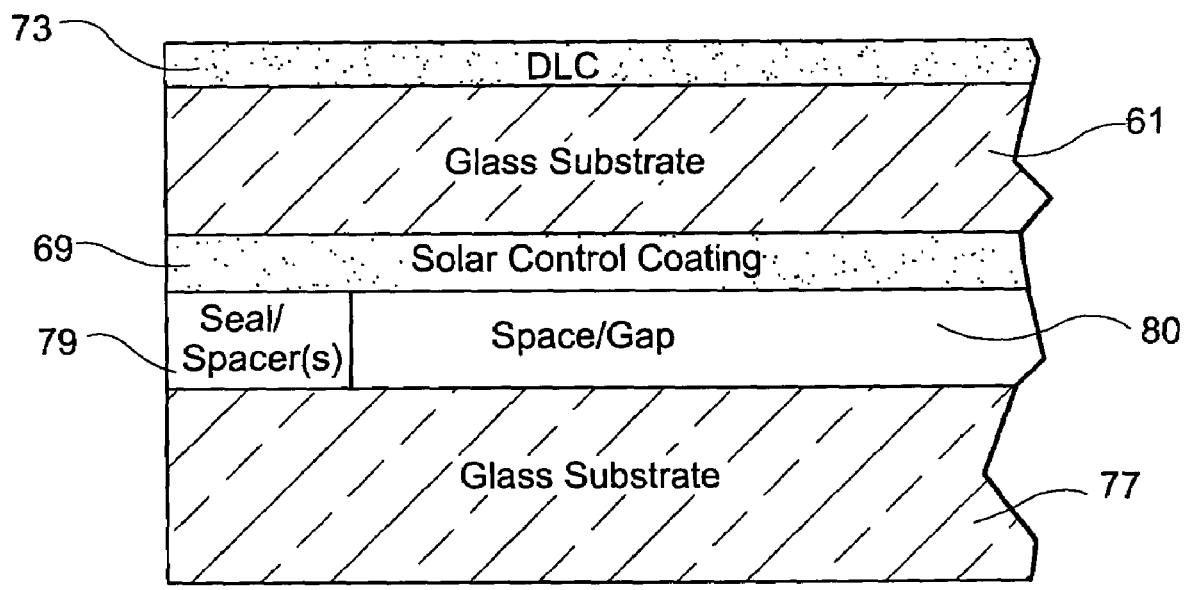

Example coated articles produced by the coating apparatus of FIG. 2 are shown in FIGS. 3–4. The coated article of FIG. 3 includes solar control coating 69 on one side of substrate 61 and protective coating 73 on the other side of the substrate. Both coatings 69, 73 were applied using a single coating apparatus (i.e., without having to remove the substrate from a first coating apparatus and then transport it to a remote location to another coating apparatus). Moreover, the ion beam deposition process used is such that it is particularly adaptable to application to the bottom side B of the substrate 61 (i.e., from an elevation below the substrate, with the ion beam being directly upwardly toward the moving substrate).

FIG. 4 illustrates the FIG. 3 coated article being used in an application such as an insulating glass (IG) window unit. In FIG. 4, the coated article of FIG. 3 has been coupled to another glass substrate 77 via one or more spacer(s)/seal(s) 79 to form the IG window unit. In the coated article of FIG. 4, the spacer(s) and/or seal(s) 79 space the glass substrates 61, 77 from one another so that a space or gap 80 is provided therebetween. The space or gap 80 may or may not be filled with a gas (e.g., Ar) in certain embodiments of this invention; and may or may not be evacuated to a pressure less than atmospheric in certain embodiments of this invention. In the IG window unit of FIG. 4, it can be appreciated that the solar control coating 69 on the interior side of substrate 61 blocks/reflects at least some IR and/or UV radiation so as to maintain the interior of a building or the like at a more comfortable temperature; while the protective coating 73 on the exterior side of substrate 61 may make the IG unit more scratch resistant and/or otherwise durable than it otherwise would have been.

With respect to ion beam sources 71, 75 that may be used in different embodiments of this invention (for ion beam deposition, cleaning and/or milling), any type of suitable ion beam source(s) may be used. For purposes of example and without limitation, any of the ion beam sources disclosed or described in any of U.S. Pat. Nos. 6,359,388, 6,303,225, 6,002,208, 6,153,067, 6,338,901, 5,888,593, or 6,261,693 may be used in accordance with this invention, all of these patents being hereby incorporated herein by reference.

Figure 5:
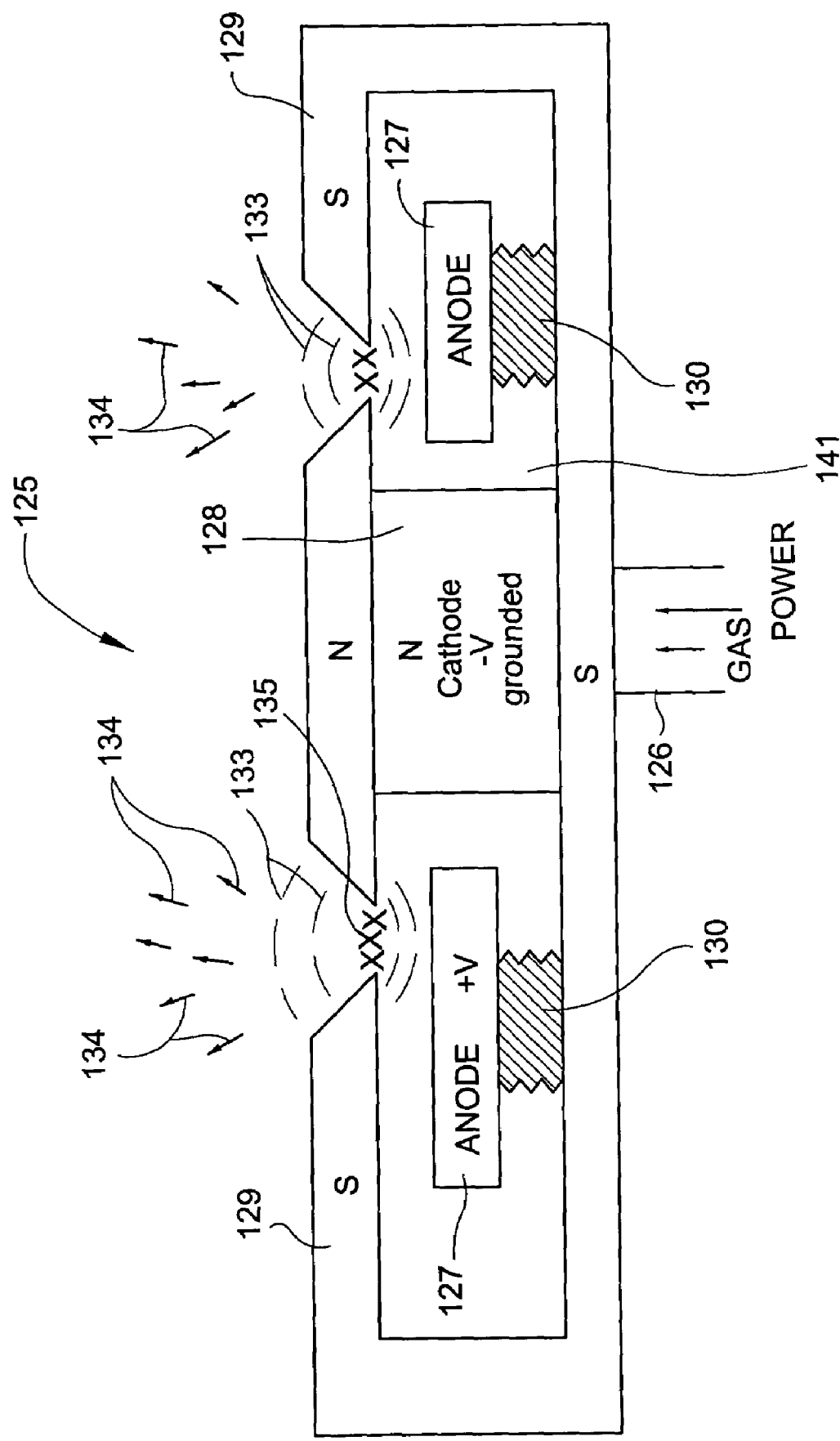
FIG. 5 is a side cross sectional view of an example, but non-limiting, ion beam source which may be used in certain embodiments of this invention
Figure 6:
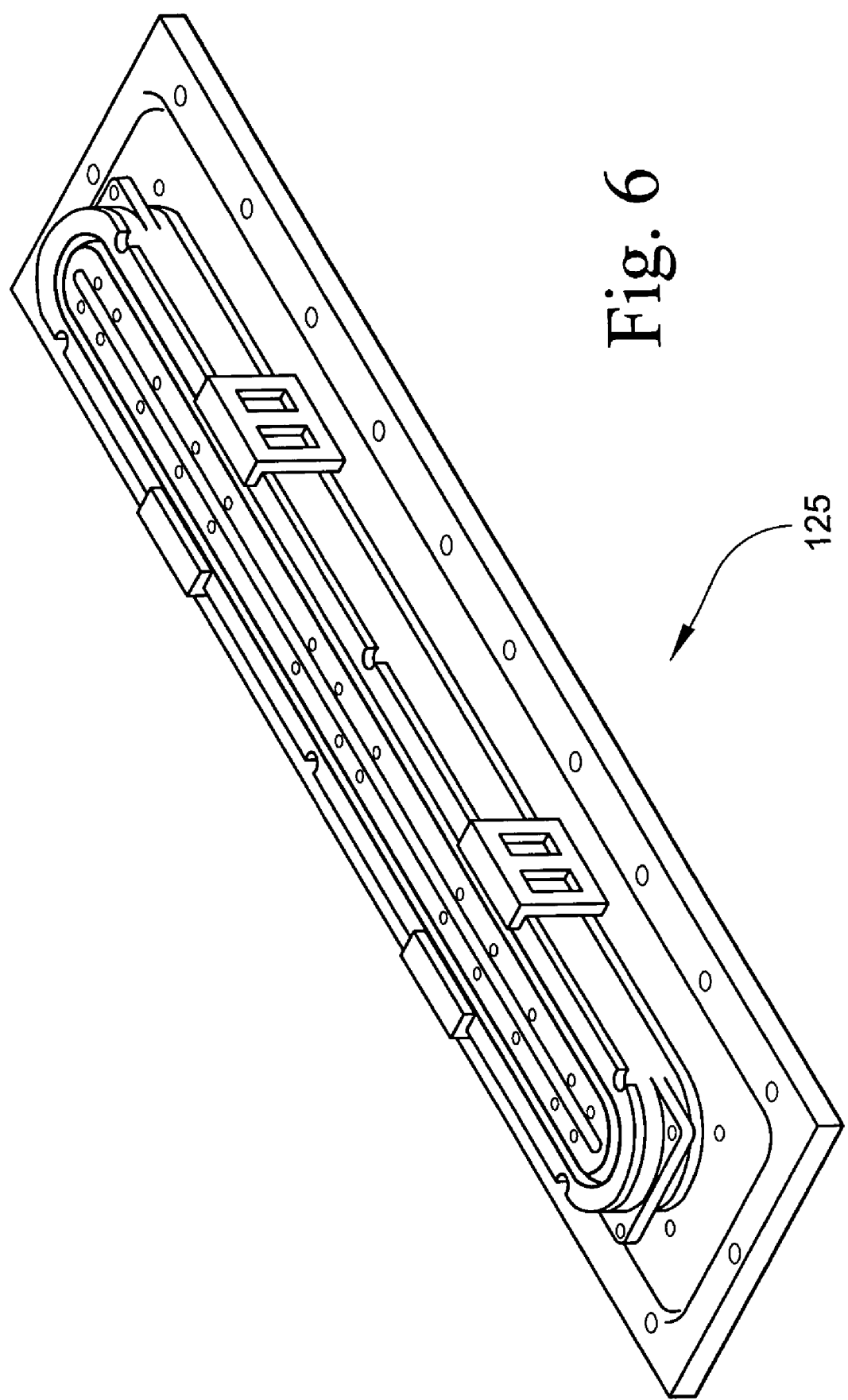
FIG. 6 is a perspective view of the ion beam source of FIG. 5.

For purposes of example only, and without limitation, FIGS. 5–6 illustrate an example linear or direct ion beam source 125 which may be used to clean or mill substrate 61 and/or to deposit coating 73 onto the substrate 61 (i.e., the source shown may be used as one or both of 71, 75). Ion beam source 125 includes gas/power inlet 126, racetrack-shaped anode 127, grounded cathode magnet portion 128, magnet poles 129, and insulators 130. A 3–5 kV DC (or AC) power supply may be used for source 125 in some embodiments. Linear source ion deposition allows for substantially uniform deposition of a DLC inclusive layer, or any other suitable layer, as to thickness and stoichiometry. Gas(es)

and/or ion energy may be adjusted to make the coating non-uniform if desired. Ion beam source 125 is based upon a known gridless ion source design. The linear source includes a linear shell (which is the cathode and grounded) inside of which lies a concentric anode (which is at a positive potential). This geometry of cathode-anode and magnetic field 133 gives rise to a closed drift condition. The magnetic field configuration further gives rise to an anode layer that allows the linear ion beam source to work absent any electron emitter in certain instances. The ion source can also work in a reactive mode (e.g., with oxygen and/or nitrogen) in certain cases. The source includes a metal housing with a slit in a shape of a race track as shown in FIGS. 5–6. The hollow housing is at ground potential. The anode electrode is situated within the cathode body (though electrically insulated) and is positioned just below the slit. The anode can be connected to a positive potential as high as 3,000 or more volts. Both electrodes may be water cooled in certain embodiments.

Feedstock gases (e.g., acetylene, etc.) are fed through the cavity 141 between the anode and cathode. For example, argon gas may be used when the source is used for cleaning and/or milling; while a hydrocarbon gas (e.g., acetylene) may be used when the source(s) is used to deposit a layer(s) of DLC. The linear ion source may also contain a labyrinth system that distributes the precursor gas evenly along its length and which allows it to expand between the anode-cathode space internally. The electrical energy then cracks the gas to produce a plasma within the source. The ions are expelled out and directed toward the substrate on which the layer(s) is to be grown. The ion beam emanating from the slit is approximately uniform in the longitudinal direction and may have a Gaussian profile in the transverse direction. Ion beams may be focused, collimated or diffuse in different embodiments of this invention. Exemplary ions 134 directed toward the substrate are shown in FIG. 5. A linear source as long as 0.5 to 4 meters may be made and used, although sources of different lengths are anticipated in different embodiments of this invention. Electron layer 135 is shown in FIG. 5 and completes the circuit thereby enabling the ion beam source to function properly.

Figure 7:
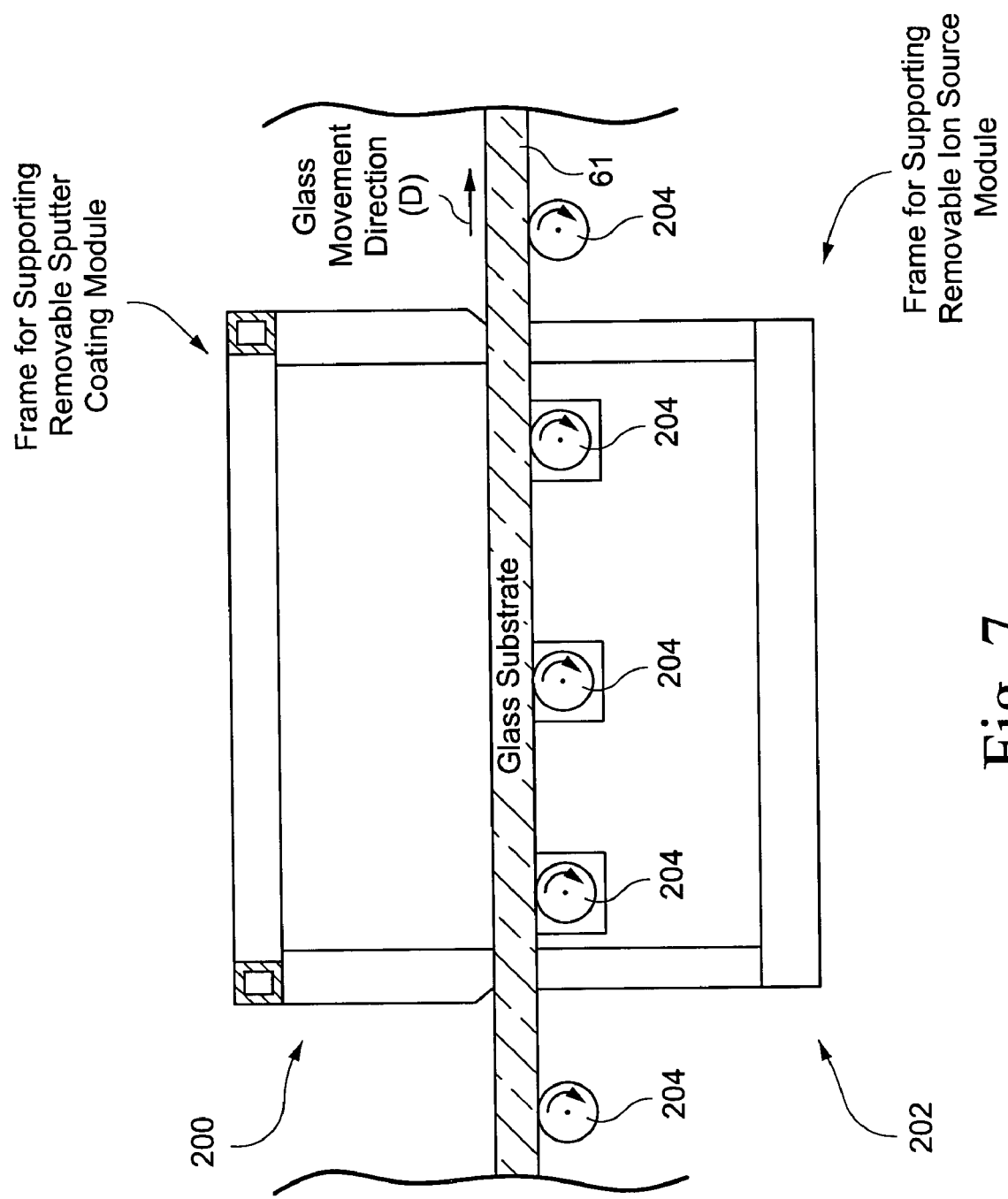
FIG. 7 is a side plan, partial cross sectional, view illustrating part of a coating apparatus according to an example embodiment of this invention, where a dual mode chamber is provided.
Figure 8:
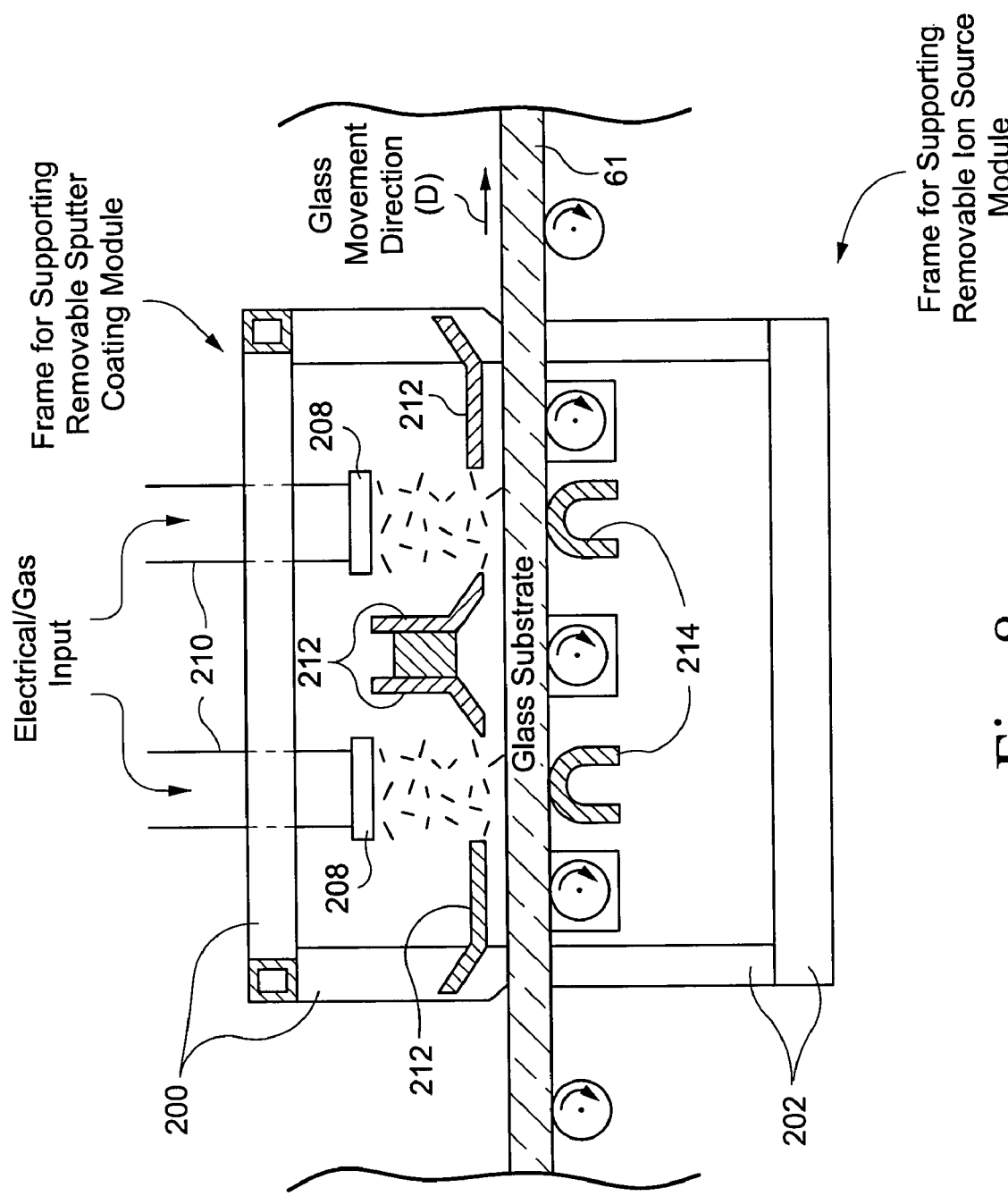
FIG. 8 is a side plan, partial cross sectional, view illustrating part of a coating apparatus according to the FIG. 7 embodiment, wherein the dual mode chamber is shown in a sputter configuration (with sputter module installed).
Figure 9:
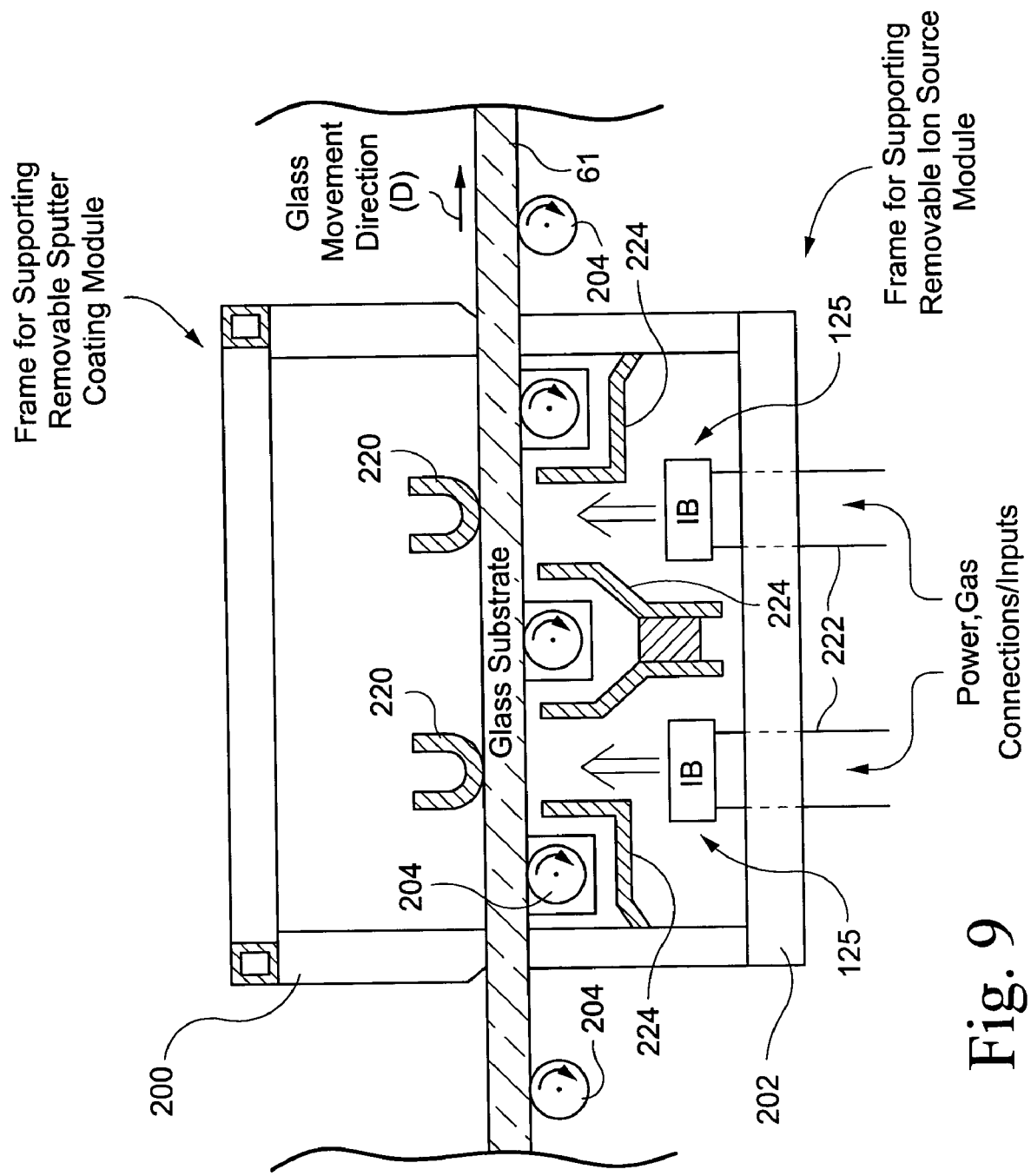
FIG. 9 is a side plan, partial cross sectional, view illustrating the coating apparatus of FIG. 7, where the dual mode chamber is shown in an ion beam deposition configuration (with an ion beam source installed, and the sputter module removed).

Referring to FIGS. 7–9, a dual mode chamber may be used in the apparatus of certain embodiments of this invention. The dual mode chamber may be located, for example, at the beginning of a sputter coating apparatus, proximate a central area of a coating apparatus, and/or at the end of a sputtering coating apparatus. In certain embodiments, the dual mode chamber may include first and second removable deposition modules; where the first deposition module is adapted to be located above the substrate and the second deposition module is adapted to be located below the substrate directly or otherwise across from the first module.

FIG. 7 is a side plan, partial cross sectional, view illustrating at least part of a dual mode chamber according to an example of this invention. The chamber includes first and second support portions on opposites sides of a moving glass substrate which is adapted to move in direction D. A frame 200 is provided at least partially above and on a top side of the moving glass substrate, whereas another frame 202 is provided below and on a bottom side of the moving glass substrate 61. Rollers 204 are adapted to support the substrate as it moves through the coating apparatus. Frame 200 is adapted to support a sputter coating module including at least one sputtering target, whereas frame 202 is adapted to support an ion source module including at least one ion source. However, frame 200 (and/or 202) may be used to support either a sputtering module or an ion module in certain alternative embodiments of this invention. The frames 200 and 202 are shown empty in FIG. 7, where no sputter coating module or ion source is installed. Frames 200 and 202 may be located directly across the substrate 61 from one another in certain example embodiments of this invention, or alternatively may be located across the substrate 61 from one another but laterally spaced from one another in other embodiments of this invention.

FIG. 8 is side plan, partial cross sectional, views illustrating part of a coating apparatus according to the FIG. 7 embodiment, where the dual mode chamber is shown in a sputter configuration (with sputter module installed). In this particular example configuration, the sputter module is installed on top of the glass substrate, but the ion source is not installed on the bottom of the substrate. As shown in FIG. 8, the sputter module on the top side of the substrate 61 is supported by frame 200, and includes sputtering target(s) 208 and structure 210 for allowing electrical signals, gases and the like to be supplied to the targets of the sputtering module. The targets 208 may be of the magnetron (e.g,. dual c-mag) rotating type, the planar type, or any other suitable sputtering target type. Shields 212 are provided in order to prevent the sputtering material from accumulating in undesired locations. Moreover, in certain example embodiments, shields 212 and a false wall(s) (not shown) provided under the substrate in areas between shields may function to prevent or reduce drops (or increases) in pressure when there is a gap or space between adjacent substrates 61 moving through the apparatus. Additionally, when the ion source module is not installed, support beams 214 may be provided between rollers under the substrate in order to support the substrate and/or the pressure false wall(s) (not shown) discussed above. Seats relating to opening(s) in frame 202 are sealed with gaskets or the like in the FIG. 8 embodiment.

Figure 10:
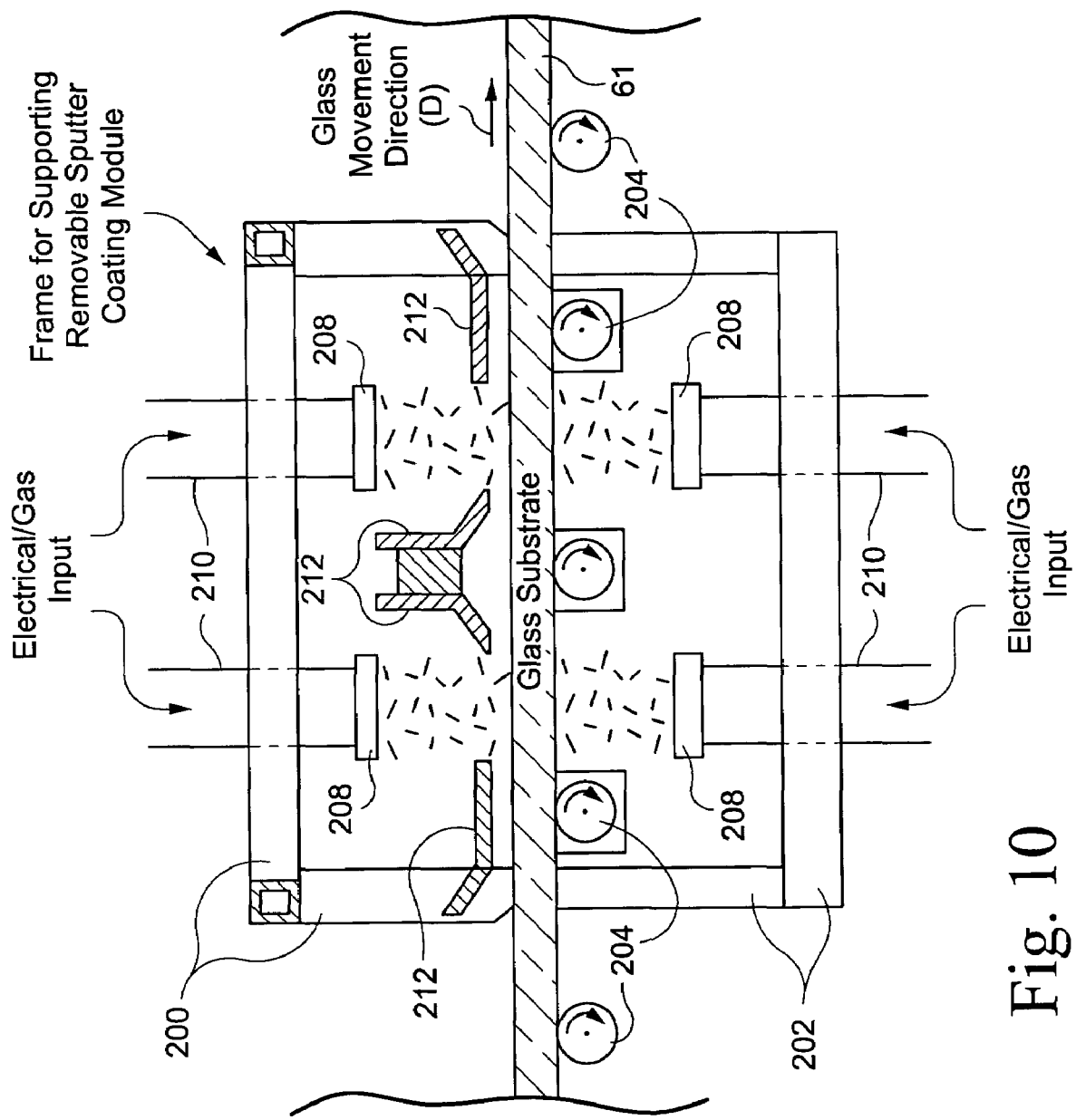
FIG. 10 is a side plan, partial cross sectional, view illustrating the coating apparatus of FIG. 7, where the dual mode chamber is shown in a situation where sputter modules are installed in both locations, i.e., above and below the moving substrate.

When it is desired to change the apparatus from a sputtering configuration to an ion beam configuration, the sputtering module shown in FIG. 8 above the substrate may (or may not) be removed and an ion beam module inserted as shown in FIG. 9. In the example illustrated in FIG. 9, the sputtering module of FIG. 8 has been removed and replaced with at least lateral support beam(s) 220 above the substrate. Supports 220 within frame 200 are for supporting a false wall (not shown) located above the substrate; the false wall, as described above, is for prevent/reducing significant pressure changes due to spaces or gaps which occur between adjacent substrates 61 passing through the apparatus during operation. Meanwhile, the ion beam module has been installed below the moving glass substrate as shown in FIG. 9, where the ion beam module includes at least one ion source 125 and structure 222 for permitting gas(es) and electrical signals to be input to or used by the ion sources. When the ion source module has been installed, the hole in frame 202 for allowing inserting of the ion source module is sealed around the module with gasket(s) or the like. Shields 224 are provided in order to prevent ion source material from depositing on rollers and disrupting operation of the same. Thus, FIGS. 9–10 illustrates the dual mode chamber in an ion beam configuration; where the ion beam may be used to mill a surface of the substrate or to deposit a coating thereon. In certain example embodiments of this invention, certain rollers 204 may be removable in order to attachment and/or removal of the lower module and/or frame.

In certain embodiments of this invention, other sputter coating chambers (not shown in FIGS. 7–9—but see FIGS. 1–2) may be located-in the apparatus laterally offset from the dual mode chamber and thus laterally offset from the FIG. 8–9 ion beam module. In such embodiments, at least one sputtering target is used for sputtering a first coating onto a first side of the glass substrate and simultaneously at least one ion source (see FIG. 9) may be used to mill and/or ion beam deposit a second coating onto a second side of the glass substrate opposite the first side. Thus, the ion beam source on one side of the moving substrate and the sputtering target(s) on the other side of the substrate need not be directly opposite one another (i.e., they may be laterally spaced from one another in certain embodiments).

In other example embodiments of this invention, the dual mode chamber of FIG. 7 may be configured so as to simultaneously include two modules above and below the substrate respectively. For example, the dual mode chamber may include a first deposition module supported by frame 200 above the moving glass substrate 61 and a second deposition module supported by frame 202 located below the glass substrate directly across from the first module. In such an example embodiment, the first and second deposition modules on opposite sides of the substrate (a) may both be ion beam deposition modules, (b) may both be sputtering modules, or (c) one may be an ion beam deposition module and the other a sputtering module. For example, and without limitation, FIG. 10 illustrates an embodiment of the instant invention where both frame 200 and frame 202 each support a different sputtering module so that layer(s) can simultaneously be sputtered onto both sides of the moving substrate 61. In other situations, the two sputtering modules shown in FIG. 10 may each be replaced with an ion source module so that simultaneously first and second ion sources may direct ions (for milling or layer deposition) at the substrate from opposite sides thereof, respectively. It is noted that when frames 200 and 202 each support a module (ion source module or sputtering module), the two modules need not be used simultaneously in certain embodiments of this invention although both are present.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coating apparatus for forming first and second coatings on a horizontally-aligned glass substrate, the coating apparatus comprising:
    at least one sputtering target positioned so as to be located at an elevation above the horizontally-aligned glass substrate passing through the apparatus, wherein the at least one sputtering target is to be used for sputtering a first coating onto a first side of the horizontally-aligned glass substrate as the substrate moves laterally through the coating apparatus; and
    at least one ion beam source positioned so as to be located at an elevation below the glass substrate so that the ion beam source but no sputtering target is located below the glass substrate, wherein the at least one ion beam source is to be used to ion beam deposit a second coating onto a second side of the glass substrate opposite the first side.

2. The coating apparatus of claim 1, wherein the sputtering target and the ion beam source are, at least at a given point in time, to be in operation simultaneously so that at the given point in time the first and second coatings are being simultaneously deposited onto the first and second sides of the substrate, respectively.

3. The coating apparatus of claim 1, further comprising another ion beam source for milling off at least 2 Å of glass from the substrate before at least one of the coatings is applied to the substrate.

4. The coating apparatus of claim 3, wherein the another ion beam source is to be located at an elevation below the substrate so that the another ion beam source and the at least one ion beam source are to be located on the same side of the substrate in the apparatus.

5. The coating apparatus of claim 1, wherein the sputtering target and the ion beam source are located in a common chamber of the apparatus.

6. The coating apparatus of claim 1, wherein the sputtering target and the ion beam source are located in different chambers of the coating apparatus, wherein the different chambers can be maintained at different pressures during coating operations.

7. A method of coating a horizontally-aligned glass substrate, the method comprising:
    moving the horizontally-aligned glass substrate through a coating apparatus; and
    while the glass substrate is moving through the coating apparatus, simultaneously sputtering a first coating having at least one layer onto a first side of the glass substrate and ion beam depositing a second coating onto a second side of the substrate that is opposite the first side, and wherein at least one ion source for ion beam depositing the second coating is located under the horizontally-aligned glass substrate so that the ion source but no sputtering target is located under the glass substrate.

8. The method of claim 7, wherein the first coating comprises a layer comprising Ag provided between at least first and second dielectric layers.

9. The method of claim 7, wherein the second coating comprises at least one layer comprising diamond-like carbon (DLC).

10. The method of claim 9, wherein the DLC comprises more $sp^3$ carbon-carbon bonds than $sp^2$ carbon-carbon bonds.

11. The method of claim 10, wherein the layer comprising DLC has an average hardness of at least 10 GPa.

12. The method of claim 11, wherein the layer comprising DLC has an average hardness of at least 20 GPa.

13. The method of claim 11, wherein the layer comprising DLC is hydrogenated.

14. The method of claim 7, further comprising using at least first, second and third sputtering targets in sputtering the first coating onto the substrate, wherein the first target comprises at least one of silicon, tin, titanium, and zinc, and the second target includes silver (Ag).

15. The method of claim 14, wherein the third target comprises at least one of silicon, tin, titanium and zinc.

16. The method of claim 7, further comprising, prior to ion beam depositing the second coating, ion beam milling off at least 2 Å of glass from the second side of the substrate using an ion beam source located at an elevation below the substrate.

17. A coating apparatus for forming first and second coatings on a horizontally-aligned substrate, the coating apparatus comprising:
    at least one sputtering target for sputtering a first coating onto a first side of the horizontally aligned substrate;
    at least one ion beam source for ion beam depositing a second coating onto a second side of the horizontally-aligned substrate, wherein the sputtering target and the ion beam source each deposit the respective coatings on the horizontally-aligned substrate as the substrate moves laterally through the coating apparatus; and wherein the at least one sputtering target is located at an elevation above a conveying roller and the at least one ion beam source is located at an elevation below the conveying roller so that the ion beam source but no sputtering target is located at an elevation below the conveying roller.

18. The coating apparatus of claim 17, wherein the sputtering target and the ion beam source are, at least at a given point in time, to be in operation simultaneously so that at the given point in time the first and second coatings are being simultaneously deposited onto the first and second sides of the substrate, respectively.

19. The coating apparatus of claim 17, further comprising another ion beam source for milling off at least 2 Å of glass from the substrate before at least one of the coatings is applied to the substrate.

20. The coating apparatus of claim 19, wherein the another ion beam source is to be located at an elevation below the substrate so that the another ion beam source and the at least one ion beam source are to be located on the same side of the substrate.

21. The coating apparatus of claim 17, wherein the sputtering target and the ion beam source are located in a common chamber of the apparatus.

22. The coating apparatus of claim 17, wherein the sputtering target and the ion beam source are located in different chambers of the coating apparatus, wherein the different chambers can be maintained at different pressures during coating operations.

23. The coating apparatus of claim 17, further comprising a dual mode chamber for selectively receiving a removable ion source module on one side of the substrate and a removable sputtering module on an opposite side of the substrate; and means for replacing the removable sputtering module with an ion source module.

24. The coating apparatus of claim 23, wherein the dual mode chamber is designed so that the ion source module and the sputtering module may be located on opposite sides of the substrate directly across from one another.

* * * * *